United States Patent [19]

Neudeck et al.

[11] Patent Number: 5,349,228
[45] Date of Patent: Sep. 20, 1994

[54] DUAL-GATED SEMICONDUCTOR-ON-INSULATOR FIELD EFFECT TRANSISTOR

[75] Inventors: Gerold W. Neudeck; Suresh Venkatesan, both of West Lafayette, Ind.

[73] Assignee: Purdue Research Foundation, West Lafayette, Ind.

[21] Appl. No.: 163,322

[22] Filed: Dec. 7, 1993

Related U.S. Application Data

[62] Division of Ser. No. 815,121, Dec. 27, 1991, Pat. No. 5,273,921.

[51] Int. Cl.$^5$ .................. H01L 29/78; H01L 27/01; H01L 27/13
[52] U.S. Cl. .................. 257/365; 257/401; 257/347
[58] Field of Search .............. 257/365, 401, 347, 348, 257/350, 351, 352, 353, 349

[56] References Cited

U.S. PATENT DOCUMENTS

| | | | |
|---|---|---|---|
| 3,872,491 | 3/1975 | Hanson et al. | 357/23 |
| 4,115,914 | 9/1978 | Harari | 29/571 |
| 4,409,727 | 10/1983 | Dalton, Jr. et al. | 29/571 |
| 4,419,809 | 12/1983 | Riseman et al. | 29/571 |
| 4,445,267 | 5/1984 | De La Moneda et al. | 29/571 |
| 4,467,518 | 8/1984 | Bansal et al. | 29/571 |
| 4,574,209 | 3/1986 | Lade et al. | 307/577 |
| 4,628,589 | 12/1986 | Sundaresan | 29/571 |
| 4,737,828 | 4/1988 | Brown | 357/23.1 |
| 4,882,100 | 11/1989 | Czubatyj et al. | 437/100 |
| 4,900,690 | 2/1990 | Tamura | 437/43 |
| 4,907,041 | 3/1990 | Huang | 357/4 |
| 4,945,067 | 7/1990 | Huang | 437/41 |
| 4,980,308 | 12/1990 | Hayashi et al. | 257/349 |
| 4,997,785 | 3/1991 | Pfiester | 437/57 |
| 4,999,314 | 3/1991 | Pribat et al. | 437/89 |
| 5,032,529 | 7/1991 | Beitman et al. | 437/21 |
| 5,034,797 | 7/1991 | Yamanaka et al. | 357/42 |
| 5,144,390 | 9/1992 | Matloubian | 257/336 |
| 5,198,379 | 3/1993 | Adan | 437/41 |

FOREIGN PATENT DOCUMENTS 62-254465 11/1987 Japan .................. 257/347

OTHER PUBLICATIONS

Ogura et al., "Design and Characteristics of the Lightly Doped Drain-Source (LDD) Insulated Gate FET" IEE Trans. on Elect. Dev. vol. ED-27 No. 8 Aug. 1980 pp. 1359-1367.
Francis Balestra, et al., "Double-Gate Silicon-on-Insulator Transistor with Volume Inversion: A New Device with Greatly Enhanced Performance", IEEE Electron Device Letters, vol. EDL-8, No. 9, Sep. 1987.
A. O. Adan, et al., "Analysis of Submicron Double-Gated Polysilicon MOS Thin Film Transistors", IEEE, IEDM 90, pp. 399-402.

(List continued on next page.)

Primary Examiner—Jerome Jackson
Assistant Examiner—Donald L. Monin, Jr.
Attorney, Agent, or Firm—Bell, Seltzer, Park & Gibson

[57] ABSTRACT

A method for forming a dual-gated Semiconductor-On-Insulator (SOI) field effect transistor for integrated circuits includes the formation of a gate/oxide/channel/oxide/gate stack on top of an insulating layer. The process begins with the formation of a first gate electrode and first oxide layer on an insulating layer. Then, a seed hole in the insulating layer is formed exposing the underlying substrate. This is followed by the epitaxial lateral overgrowth (ELO) of monocrystalline silicon, for example, from the seed hole to on top of the first oxide layer. This monocrystalline layer forms the device channel. A second oxide and second gate electrode layer are then grown and deposited, respectively. Subsequent etch steps employing sidewall spacers are then employed to form a multilayered stack having self-aligned first and second gate electrodes. Sidewall seed holes are then used to epitaxially grow monocrystalline source and drain regions from the channel. In-situ doping can be provided to form a lightly doped source (LDS) and drain (LDD) structure with vertically displaced source and drain contacts.

12 Claims, 8 Drawing Sheets

OTHER PUBLICATIONS

Peter J. Schubert, et al., "Confined Lateral Selective Epitaxial Growth of Silicon for Device Fabrication", IEEE Electron Device Letters, vol. 11, No. 5, May 1990.

R. Bashir, et al., "A Novel Three Dimensional BICMOS Process Using Epitaxial Lateral Overgrowth of Silicon", Custom Integrated Circuits Conference, May 1991.

Peter J. Schubert, et al., "Vertical Bipolar Transistors Fabricated in Local Silicon on Insulator Films Prepared Using Confined Lateral Selective Epitaxial Growth (CLSEG)", IEEE Trans on Elec Dev, vol. 37, No. 11, Nov. 1990.

James W. Siekkinen, et al., "Selective Epitaxial Growth Silicon Bipolar Transistors for Material Characterization", IEEE Transactions on Electron Devices, vol. 35, No. 10, Oct. 1988.

Digh Hisamoto, et al., "A Fully Depleted Lean-Channel Transistor (DELTA)-A novel vertical ultra thin SOI MOSFET-", IEEE 1989, IEDM 89, pp. 833-836.

J. P. Colinge, et al., "Silicon-On-Insulator Gate-All-1-Around Device", IEEE 1990, IEDM 90, pp. 595-598.

K. Hieda, et al., "Floating-Body Effect Free Concave SOI-MOSFETs (COSMOS)", IEEE 1991, IEDM 91, pp. 667-670.

T. Tanaka, et al., "Analysis of P+ Poly Si Double-Gate Thin-Film SOI MOSFETS", IEEE, 1991, IEDM 91, pp. 683-686.

DUAL-GATED SEMICONDUCTOR-ON-INSULATOR FIELD EFFECT TRANSISTOR

This application is a divisional of application Ser. No. 07/815,121, filed Dec. 27, 1991, now U.S. Pat. No. 5,273,421.

FIELD OF THE INVENTION

This invention relates to field effect transistors for large scale integration, and more particularly to dual-gated Semiconductor-On-Insulator (SOI) field effect transistors, and methods for fabricating the same.

BACKGROUND OF THE INVENTION

Despite the recent and significant improvements made in Very-Large-Scale-Integration (VLSI) and VLSI circuit design, there is a continuing need for faster and more reliable devices capable of being more highly integrated. Moreover, whereas bipolar technologies have dominated high speed and high power applications in the past, Complementary Metal Oxide Semiconductor (CMOS), and more particularly Semiconductor-On-Insulator (SOI) technologies are now becoming an alternative design choice for state-of-the-art integrated circuit device applications. This is because SOI devices: (1) are inherently self-isolating and radiation tolerant, (2) have low parasitic capacitance, (3) exhibit reduced latch-up and hot-electron injection into the gate oxide and gate electrode, and (5) have improved short-channel characteristics, when compared to bulk CMOS designs. For example, these features of SOI devices are described in a publication entitled Some Properties of Thin-Film MOSFETs by Colinge, published in the IEEE Circuits and Devices Magazine, pp. 16–20, November, 1987.

Furthermore, properly designed SOI field effect transistors may be integrated with conventional bipolar designs to form three-dimensional Bipolar-CMOS (BiCMOS) integrated circuits. Thus, integrated circuit designers can incorporate the best features of bipolar technology with the best of SOI into a single design architecture. Three-dimensional integration, involving the vertical integration of semiconductor devices, provides higher integration densities compatible with the needs of VLSI without requiring additional device scaling.

Semiconductor-On-Insulator (SOI) can be achieved in silicon by several methods including Separation by IMplanation of OXygen (SIMOX) and Zone Melt Recrystallization (ZMR). In SIMOX, the insulating region is formed by ion implanting high energy oxygen. In ZMR, a polycrystalline silicon layer is deposited on an insulator and then recrystallized by laser or electron-beam scanning to form a quasi-monocrystalline layer. Since both of these techniques require high temperature anneal cycles to improve the quality of the SOI material, neither is compatible with three-dimensional integration or sub-micron BiCMOS technologies.

Recently, new techniques for fabricating SOI structures have emerged. These techniques include Epitaxial Lateral Overgrowth (ELO) and Confined Lateral Selective Epitaxial Growth (CLSEG). Both of these techniques are compatible with BiCMOS designs. For example, a publication written by Bashir, and coinventors Venkatesan and Neudeck, entitled A Novel Three Dimensional BiCMOS Technology Using Epitaxial Lateral Overgrowth of Silicon, published at the Custom Integrated Circuits Conference in May, 1991, describes a BiCMOS structure formed using ELO techniques.

Two major impediments to error-free operation in SOI field effect transistors are the parasitic bipolar transistor latch and hot-electron injection into the gate oxide. It is known in the art that when a short-channel transistor operates in the saturation mode, a high electric field can develop between the channel pinch-off and drain junctions. This operating mode can cause the generation of impact-ionized electron-hole pairs; if the generation is regeneratively sustained, catastrophic failure ("latch-up") can result. Hot electron injection into the gate oxide, a related mechanism, can occur if the generated electrons have a sufficiently high energy ("hot") to overcome the potential barrier at the gate oxide/channel interface. Over time, repeated electron injection can cause incremental threshold voltage shifts and transconductance ($g_m$) degradation; consequently, long term reliability is impaired.

Both mechanisms can be controlled, however, by designing transistors with lightly doped source (LDS) and drain (LDD) regions nearest the channel. Unfortunately, although techniques for controlling latch-up and hot-electron injection in bulk CMOS designs are well known, effective techniques for controlling these parasitics in SOI devices are not as well developed.

Another impediment to SOI device operation is the increased parasitic resistance that results from forming the source and drain in a thin film. Unlike conventional planar devices formed in bulk silicon, thin film devices are inherently more resistive at the source and drain because the cross-sectional area perpendicular to the direction of current flow is significantly reduced. Accordingly, it would be advantageous to develop SOI devices having enlarged source and drain areas adjacent the channel.

Attempts have been made to fabricate a dual-gated SOI transistor with top and bottom gate regions formed above and below the channel. For example, in a publication entitled Double-Gate Silicon-On-Insulator Transistor with Volume Inversion: A New Device with Greatly Enhanced Performance, by Balestra, et al., IEEE Electron Device Letters, Vol. EDL-8, No. 9, pp. 410–412, September 1987, a SIMOX field effect transistor is disclosed with a top and bottom gate electrode. The structure is not suited for large scale integration, however, because the bulk silicon substrate forms a common bottom gate. Accordingly, the integration of multiple devices having independently controllable bottom gates, wherein each bottom gate is electrically isolated from one another, is not possible. In order to form a bottom gate layer separate from the substrate, two oxygen implants would be required to form a double SIMOX structure. Still unsolved, however, is the problem of electrically isolating the individual bottom gates in a manner consistent with the requirements of VLSI integration.

In another article by Adan, et al. entitled Analysis of Submicron Double-Gated Polysilicon MOS Thin Film Transistors, published at the 1990 International Electron Device Meeting (IEDM) conference, pp. 399–402, a dual-gate field effect transistor formed as a sandwich of three polysilicon layers is disclosed. The top and bottom polysilicon layers form the top and bottom gate electrodes, respectively, and the channel is formed in the middle polysilicon layer. As described in the article, the grain boundaries inherent in the polycrystalline channel create a high-density of trap states and impair performance vis-a-vis devices formed of monocrystalline material. The article also discloses a technique for self-aligning the source and drain regions to the top gate, however, the bottom gate is not self-aligned to the top gate and is specifically disclosed as a layer. The presence of this layer precludes the formation of adjacent devices having separate and electrically isolated bottom gates.

In summary, the art has yet to produce a self-aligned dual-gated silicon-on-insulator field effect transistor having isolated and independently controllable top and bottom gates, a monocrystalline thin-film channel, reduced source and drain capacitance, enlarged source and drain areas adjacent the channel and improved short channel and hot carrier immunity compatible with conventional CMOS/BiCMOS applications.

SUMMARY OF THE INVENTION

It is therefore an object of the present invention to provide an improved field effect transistor and method for fabricating the same.

It is another object of the present invention to provide a field effect transistor formed on an insulator having two independently controllable gates self-aligned to one another to minimize parasitic effects.

It is still another object of the present invention to provide a field-effect transistor having a monocrystalline channel, improved short channel immunity, reduced hot carrier regeneration and reduced source and drain parasitic resistance.

These and other objects are provided according to the present invention by a silicon-on-insulator transistor for large scale integration having a monocrystalline channel and two independently controllable self-aligned gates. In particular, the self-aligned SOI structure of the present invention comprises a vertically layered gate/oxide/channel/oxide/gate stack with first and second ends. Separate source and drain regions electrically contact the channel at the first and second ends, respectively. Because there is no appreciable overlap between the source, drain and either of the gate regions, parasitic capacitances in the source and drain can be minimized. Selective epitaxial techniques are used to form the source and drain regions from the first and second ends. In addition, source and drain dopings are tailored in-situ to form Lightly Doped Source (LDS) and Drain (LDD) regions. The presence of an LDD region reduces the drain electric field in saturation and the LDS region reduces the emitter injection efficiency of the parasitic latch-up transistor. Consequently, the likelihood of latch-up or hot-electron injection failure is reduced.

According to one aspect of the present invention, the dual-gated SOI field effect transistor is formed in a self-aligned manner wherein both the top and bottom gates are aligned to the channel without reliance on critical photolithographic alignment steps. In particular, a stack is formed on the surface of a semiconductor substrate wherein said stack comprises a first (bottom) gate electrode, a first insulating layer, a monocrystalline silicon spacer layer and a second insulating layer in parallel relation to each other, and having first and second ends. The spacer layer can be monocrystalline silicon formed using either Epitaxial Lateral Overgrowth (ELO) or Confined Lateral Selective Epitaxial Growth techniques (CLSEG).

ELO techniques are described throughout the literature. For example, a publication by Siekkinen, Klaasen and coinventor Neudeck, entitled Selective Epitaxial Growth Silicon Bipolar Transistors for Material Characterization, IEEE Transactions on Electron Devices, Vol. 35, No. 10, pp. 1640–1644, October, 1988, discloses a method for forming a bipolar junction transistor using epitaxial lateral overgrowth.

The detailed fabrication steps for forming CLSEG silicon are described, for example, in a publication entitled Confined Lateral Selective Epitaxial Growth of Silicon for Device Fabrication, published by Schubert and coinventor Neudeck in the IEEE Electron Device Letters, Vol. 11, No. 5, pp. 181–183, May, 1990, the disclosure of which is herein incorporated by reference. See also U.S. Pat. No. 4,760,036 to Schubert entitled Process for Growing Silicon on Insulator Using Lateral Epitaxial Growth with Seed Window Oxidation.

Once the stack is formed, source and drain regions can be grown using conventional selective epitaxial growth techniques and seed holes at the monocrystalline silicon spacer layer ends. A second (top) gate electrode is formed on top of the second insulating layer to form a double-gated field effect transistor. By selective etching, the first gate electrode and second gate electrode can be formed in a self-aligned manner, thus reducing the parasitic source and drain capacitances.

In another aspect of the present invention, a stack is formed with a sacrificial spacer layer. In particular, monocrystalline silicon source, drain, and channel regions are together formed in a cavity using a confined lateral selective epitaxial growth technique after removal of the spacer layer. In this embodiment a substrate seed hole, as opposed to sidewall seed holes, is used to form the source, drain and channel regions.

Accordingly, the process of the present invention forms a field effect transistor with two independently controllable and isolated gates compatible with BiCMOS applications. Also, the first gate electrode and second gate electrode can be formed in a self-aligned manner to reduce the parasitic capacitance between either gate and the source and drain. Moreover, the source and drain regions can be tailor-doped to reduce the probability of latch-up or hot-electron induced failure and made large to reduce the parasitic resistances. As will be understood by one skilled in the art, enlarged source and drain regions with vertically displaced contacts become imperative for Ultra Large Scale Integrated (ULSI) MOSFETs having a film channel thickness less than 0.1 $\mu$m.

DESCRIPTION OF A PREFERRED EMBODIMENT

The present invention will now be described more fully hereinafter with reference to the accompanying drawings, in which a preferred embodiment of the invention is shown. This invention may, however, be embodied in many different forms and should not be construed as limited to the embodiment set forth herein;

rather, this embodiment is provided so that this disclosure will be thorough and complete and will fully convey the scope of the invention to those skilled in the art.

Figure 1A:
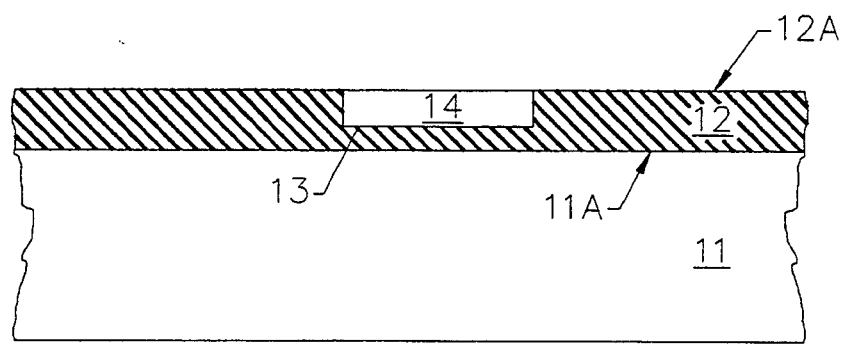
FIGS. 1A–1H illustrate a method of forming a dual-gated semiconductor-on-insulator field effect transistor according to the present invention.

Referring to FIGS. 1A–1H, a method for forming a first embodiment of a dual-gated field effect transistor for large scale integration according to the present invention will now be described. Referring now to FIG. 1A, the process begins with a semiconductor substrate 11 having a face 11A. Next, a gate electrode insulating layer 12 with top surface 12A is formed thereon. A trench 13 having a depth of about 3500 Å is then etched into top surface 12A. A polysilicon first (bottom) gate electrode 14 is then deposited and planarized coincident with surface 12A.

Figure 1B:
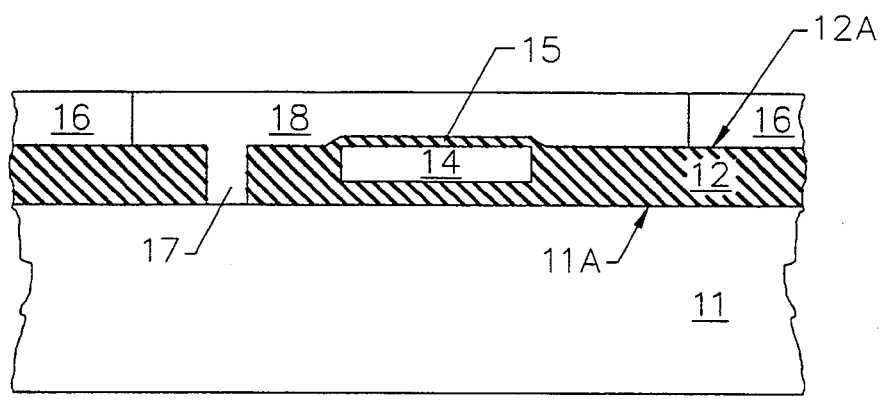

Referring now to FIG. 1B, a first insulating layer 15 is then grown on top of the first gate electrode 14. As will be understood by those skilled in the art, the first (bottom) gate electrode 14 becomes electrically isolated from adjacent regions after the formation of the first insulating layer 15, thereon.

Plasma nitride/oxide planarization etch-stops 16 are then deposited and patterned on either side of the first gate electrode 14 to define the active device regions. The thickness of the etch-stops will determine the ultimate thickness of the channel region in the completed device. A seed hole 17 for epitaxial growth can then be opened using a seed hole mask. Next, an epitaxial lateral overgrowth (ELO) of monocrystalline silicon, for example, can be carried out from the seed hole to form a monocrystalline silicon spacer layer (channel) 18. The ELO spacer layer is then chemically-mechanically planarized down to the etch-stops 16. As will be understood by one skilled in the art, the quality of the monocrystalline silicon film grown by ELO is significantly better than films formed using presently available ZMR or SIMOX techniques.

Figure 1C:
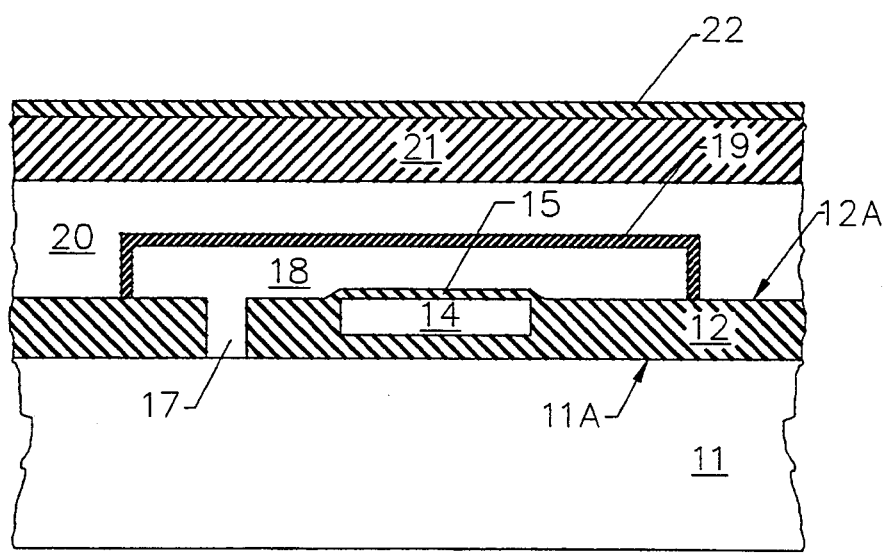
Figure 1D:
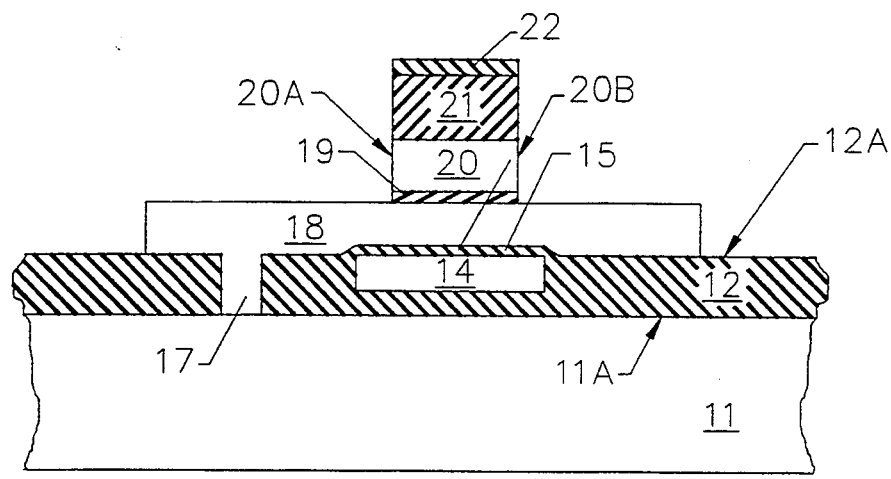

Referring now to FIG. 1C, the etch-stops 16 can be removed. This step is followed by a thin oxidation to form the second insulating layer 19. Layers of polysilicon/oxide/nitride (Si$_3$N$_4$) (20, 21, 22) are then deposited. After gate patterning, layers 22, 21, 20, and 19 are etched to form a preliminary stack, as shown in FIG. 1D. This alignment is non-critical; the only requirement is that the stack be formed on top of the first gate electrode 14 as initially defined by the trench 13. The polysilicon layer 20 comprises the second (top) gate electrode with first and second ends 20A and 20B, respectively.

Figure 1E:
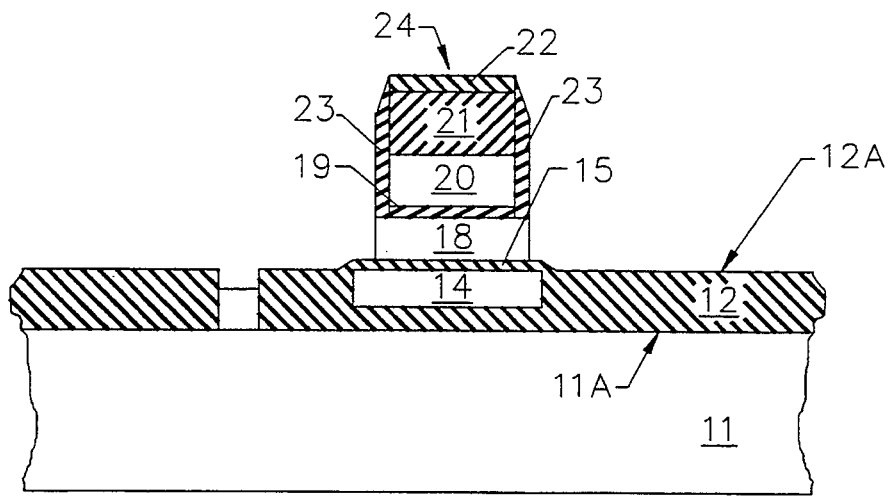

Referring to FIG. 1E, a low temperature oxide (LTO) (or nitrided oxide or nitride) is conformally formed and dry etched using conventional Reactive Ion-Etch (RIE) techniques. This forms a thin (200 Å) oxide spacer 23. Another etch step is then used to define the length of the channel or monocrystalline silicon spacer layer 18 and form a first stack 24 using the nitride cap 22 and oxide spacer 23 as an etch mask.

Figure 1F:
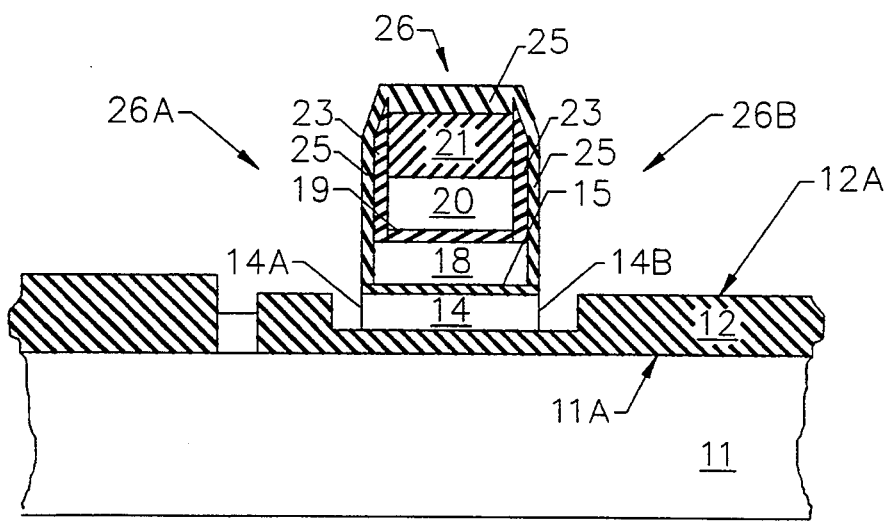

Referring to FIG. 1F, a thin nitride layer having a thickness of between 100–200 Å is conformally deposited and RIE etched back to form nitride spacers 25 on the first stack 24 sidewalls. The first insulating layer 15 and first gate electrode 14 are then etched to form a second stack 26, having first and second ends 26A and 26B, respectively. The first gate electrode has first and second ends 14A and 14B, respectively. It will be understood by one skilled in the art that the etching sequence, described thusfar, produces a structure wherein first ends 20A and 14A, and second ends 20B and 14B are formed in substantial alignment with each other and without reliance upon photolithographic masking steps. For example, in addition to being self-aligned, the extension of the first gate end 14A beyond the corresponding second gate end 20A, is limited to 400 Å (0.04 $\mu$m). In addition, the first gate ends 14A and 14B overlap the source and drain regions nearest the channel by $\leq$200 Å (0.02 $\mu$m). Consequently, the ends of the first and second gates 14 and 20, respectively, are substantially congruent. Accordingly, the limited extension of the first gate 14 beyond the ends of the monocrystalline silicon spacer layer (channel) 18 limits the size of the parasitic capacitors extending between the first gate 14 and the source and drain regions, respectively.

Figure 1G:
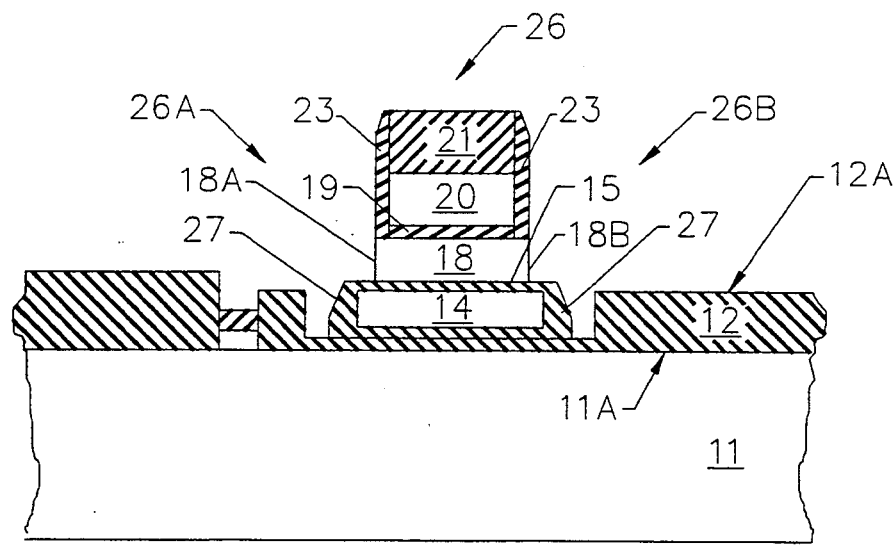

The portion of stack 26 not covered by nitride is then oxidized to form oxide sidewalls 27 to the first gate electrode 14 as shown in FIG. 1G. As will be understood by one skilled in the art, oxide sidewalls 27 electrically insulate the first and second ends 14A and 14B, respectively, from adjacent regions. Finally, nitride spacers 25 can be removed using known techniques such as wet etching. Retention of the oxide spacer 23 leaves only ends 18A and 18B at spacer layer 18 exposed.

Figure 1H:
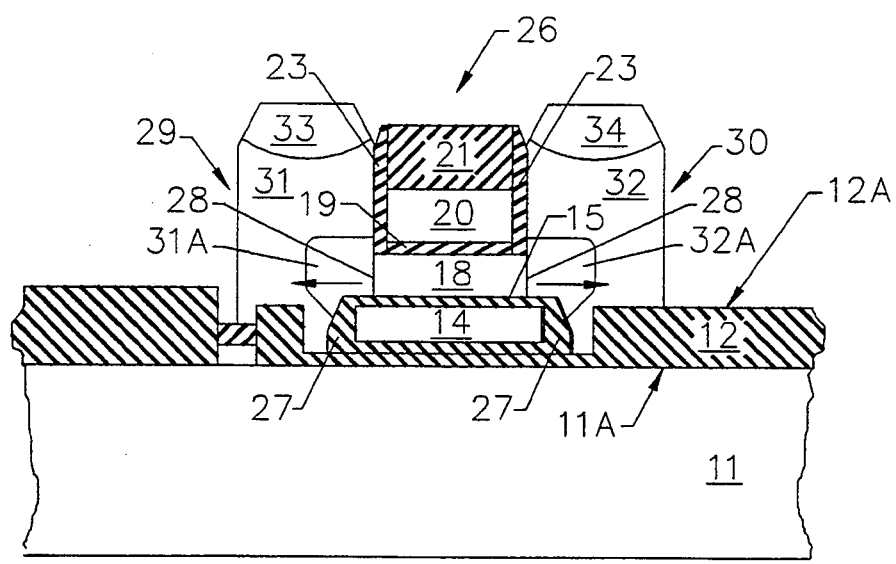

As shown in FIG. 1H, the ends 18A, 18B form the seed holes 28 for growing the first 29 and second 30 monocrystalline silicon end regions in the direction shown by the arrows. As will be understood by those skilled in the art, selective epitaxial techniques can be used to form monocrystalline silicon source 31 and drain 32 regions. In-situ doping, for example, can also be performed during the epitaxial growth to form lightly doped source (LDS) 31A and drain (LDD) 32A regions nearest the monocrystalline silicon spacer layer (channel) 18. In-situ doping can also be used to "tailor dope" the source and drain regions for a given application. Finally, n$^+$-doped regions 33 and 34 can be implanted to provide ohmic contacts to the source 31 and drain 32, respectively. Contact to the source and drain is made in regions vertically elevated from the channel 18 in order to reduce the electric field at the channel ends during "pinch-off" operation and enhance latch-up immunity. Moreover, the replacement of conventional SOI source and drain film regions with enlarged monocrystalline silicon regions reduces the parasitic source and drain resistances.

As will be understood by one having skill in the art, the types of impurities used in doping the hereinabove described regions can be changed to form a p-channel device.

Accordingly, a dual-gated semiconductor-on-insulator field effect transistor according to a first embodiment of the present invention comprises a substrate 11; a gate electrode insulating layer 12; a first (bottom) gate electrode 14; and first insulating layer 15; a channel be having ends 18A and 18B; a second insulating layer 19; a second (top) gate electrode 20; a source 31 and source contact 33; and a drain 32 and drain contact 34.

Figure 2A:
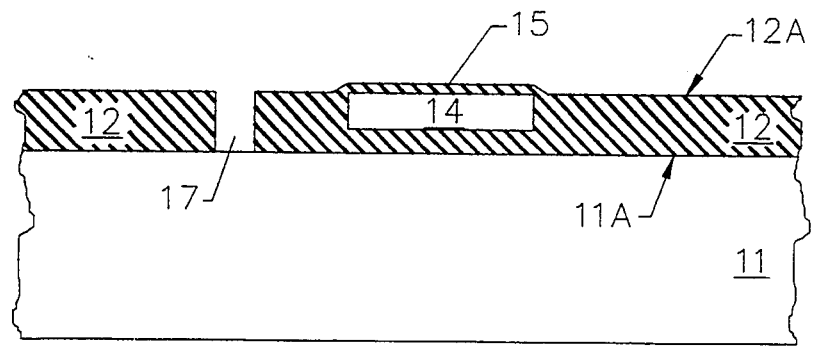
FIGS. 2A–2D illustrate an alternative method of forming the structure illustrated in FIG. 1B.

Referring to FIGS. 2A–2D, a first alternative method for forming the structure shown in FIG. 1B from the structure shown in FIG. 1A, will now be described. Referring to FIG. 2A, a first insulating layer 15 is grown on top of the first gate electrode 14. Next, a seed hole 17 for epitaxial growth is opened in insulating layer 12 to expose a portion of the substrate 11 at face 11A.

Figure 2B:
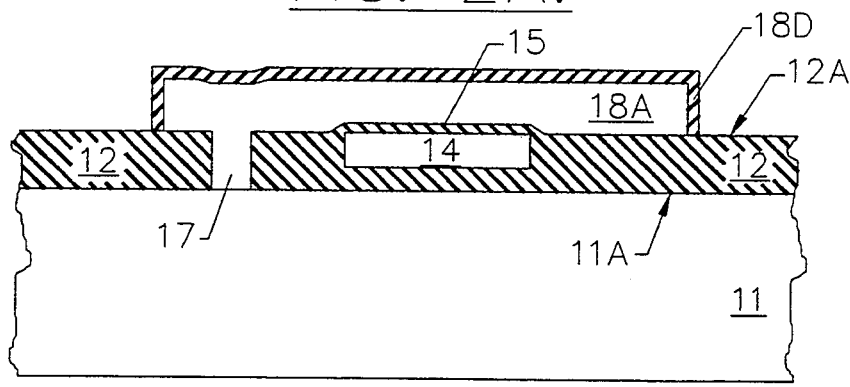

Referring to FIG. 2B, a thin sacrificial layer 18C (a:Si) is deposited and patterned using an active area mask. After a brief oxidation (not shown), a thin (approximately 1500 Å) nitride layer 18D is deposited.

Figure 2C:
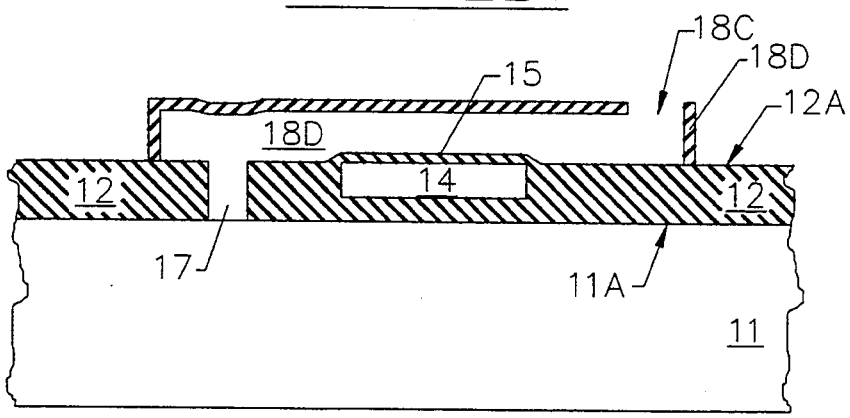

Referring now to FIG. 2C, via holes 18E are formed in the oxide and nitride layer 18D to expose the sacrificial layer 18C. Next, the sacrificial layer is selectively etched to expose a first cavity 18F. A brief wet etch is then used to open the seed hole 17 again.

Figure 2D:
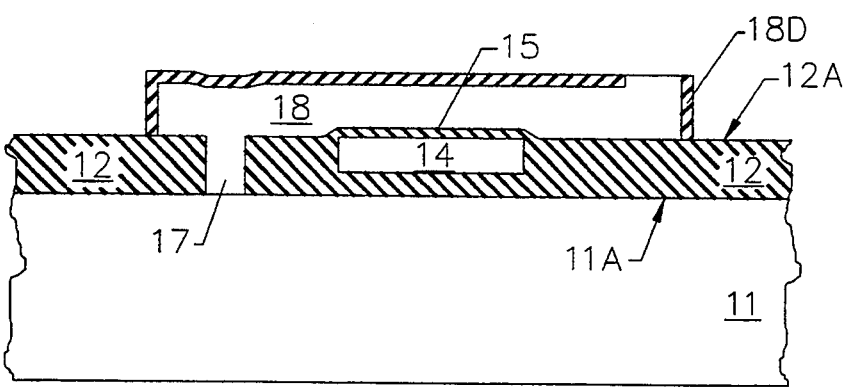

Referring now to FIG. 2D, a monocrystalline silicon spacer layer 18 is grown in the first cavity 18F using, for example, the confined lateral selective epitaxial growth technique described in a publication written by Schubert and coinventor Neudeck, entitled Confined Lateral Selective Epitaxial Growth of Silicon for Device Fabrication, IEEE Electron Device Letters, Vol. 11, No. 5, pp. 181-183, May, 1990, the disclosure of which is incorporated herein by reference. Finally, nitride layer 18D is removed.

As will be understood by those having skill in the art, final processing can proceed using the method steps corresponding to FIGS. 1C-1H.

Figure 3A:
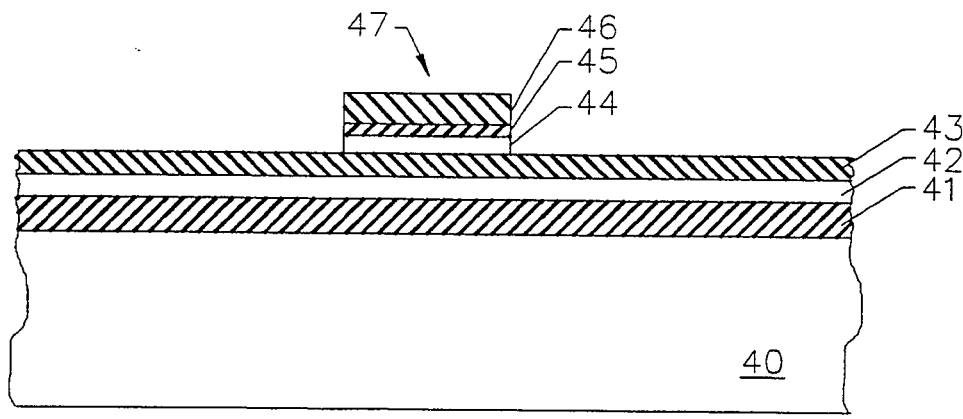
FIGS. 3A–3J illustrate an alternative method of forming a dual-gated semiconductor-on-insulator field effect transistor according to present invention using CLSEG.

Referring now to FIGS. 3A-3J, an alternative method for forming the dual-gated field effect transistor according to the present invention will be described in detail. As shown in FIG. 3A, this method begins with a semiconductor substrate 40 having a gate electrode insulating layer 41. Next, a first gate electrode layer 42 is deposited and followed by the formation of a first insulating layer 43. Next, a sacrificial amorphous silicon layer 44 is deposited. As will be understood by one having skill in the art, the thickness of layer 44 determines the thickness of the channel in the completed device. After a thin oxide layer 45 is grown, a thin (approximately 2000 Å) nitride capping layer 46 is deposited. Using a single non-critical gate mask, the layered structure is etched down to the first insulating layer 43, to form the stack 47.

Figure 3B:
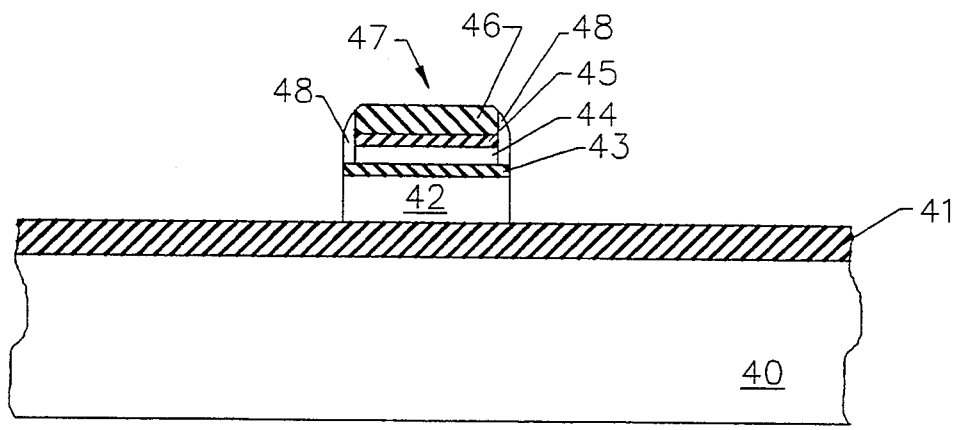

Now referring to FIG. 3B, thin nitride spacers 48 (approximately 100 Å) can be defined on the sidewalls of the stack 47. Next, RIE etching can be performed to further define the first insulating layer 43 and first (bottom) gate electrode 42. It will be understood by one skilled in the art that the alignment between the nitride capping layer 46 and first gate electrode 42 is defined by the thickness of the nitride spacers 48. Accordingly, the alignment of these two layers is not determined by photolithographic masking steps.

Figure 3C:
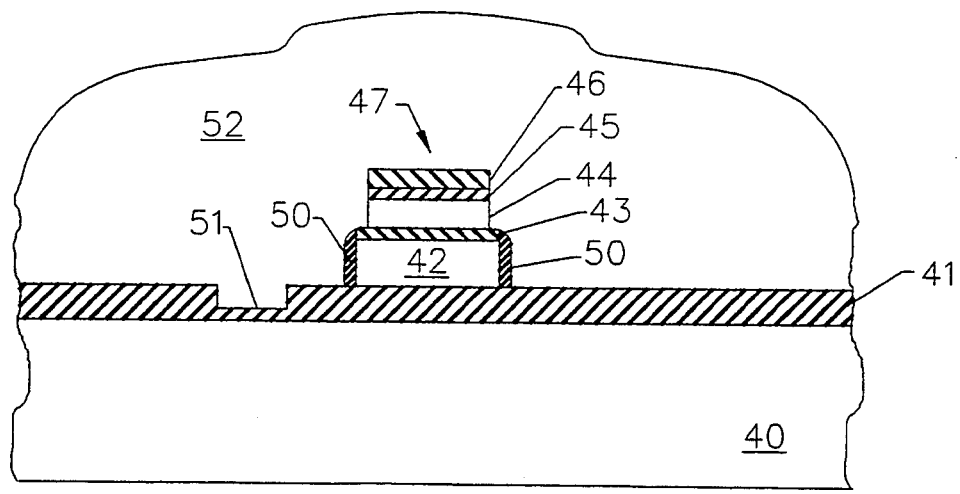
Figure 3D:
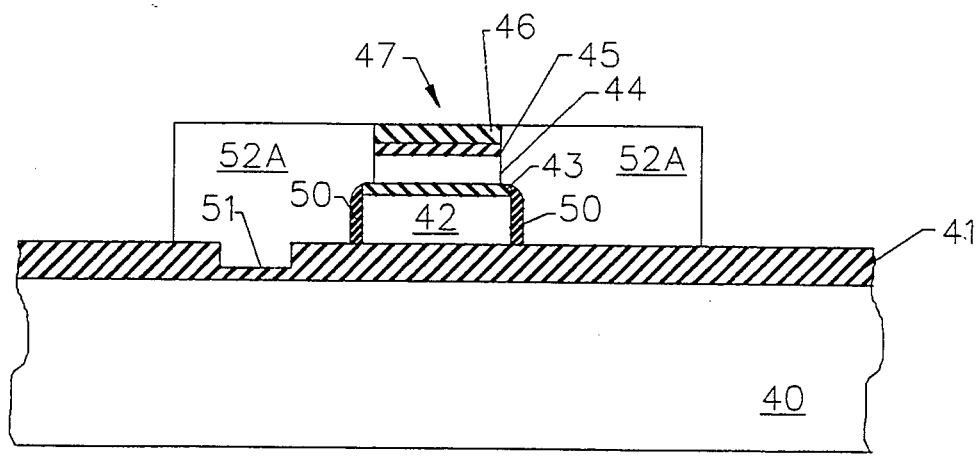

Now referring to FIG. 3C, the first gate electrode 42 is briefly oxidized at its ends to form oxide sidewalls 50. As will be understood by those skilled in the art, the oxide sidewalls 50, together with gate electrode insulating layer 41 and first insulating layer 43, form an electrically insulated region surrounding the first gate electrode 42. The thin nitride spacers 48 are then removed by wet etching. The top nitride layer 46 is preserved even after the etching because 46 is thicker than 48. Next, a seed hole 51 in layer 41 is formed. A second sacrificial layer 52 is then deposited. As shown in FIG. 3D, the sacrificial amorphous silicon layer 52 can be planarized and patterned to form a region 52A surrounding the stack 47.

Figure 3E:
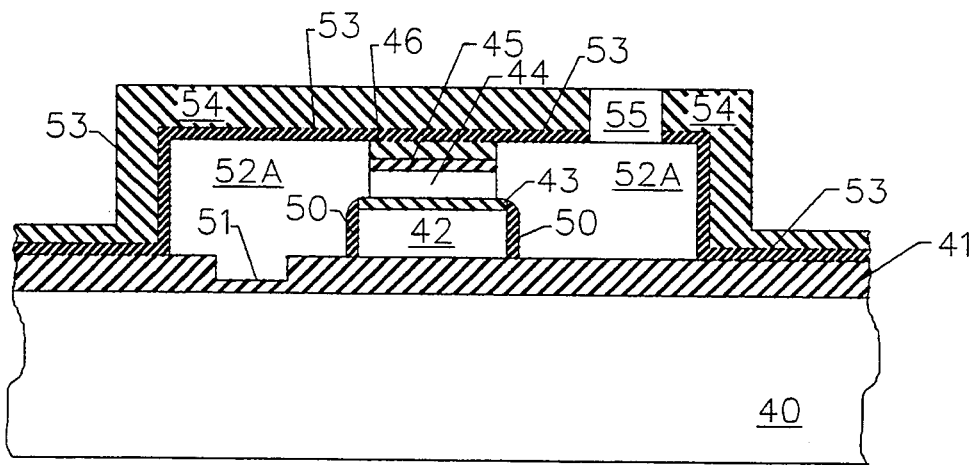
Figure 3F:
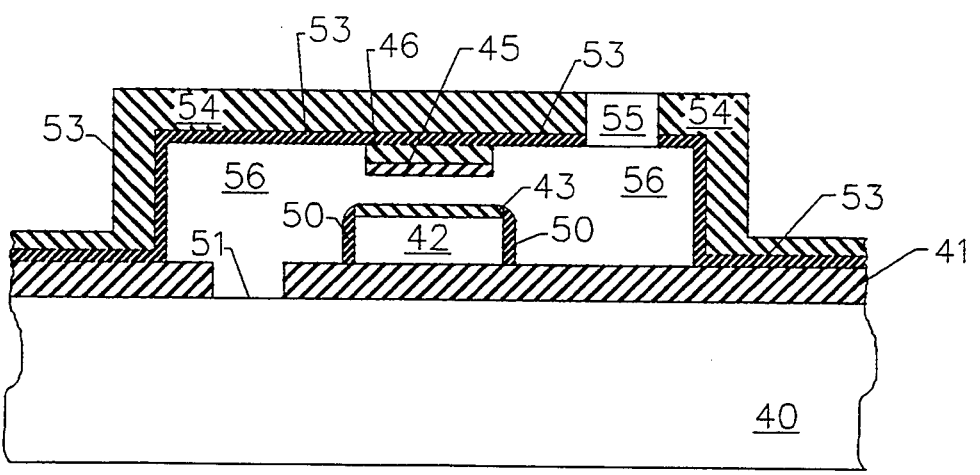
Figure 3G:
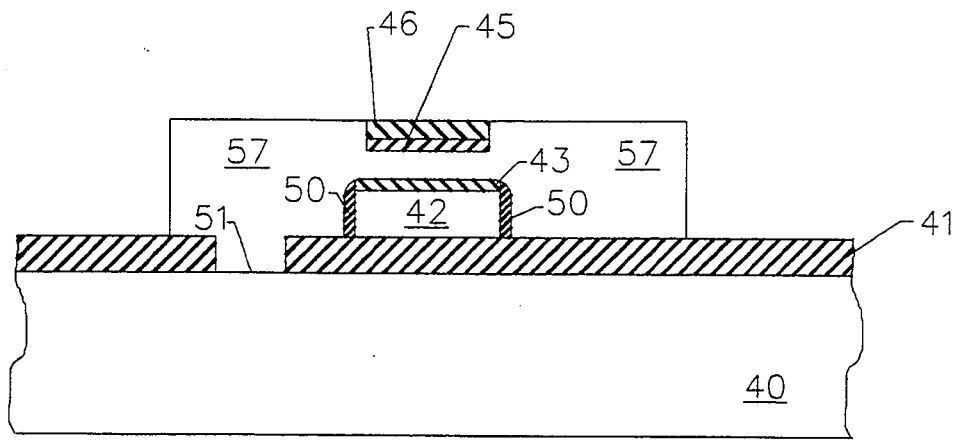

Now referring to FIGS. 3E-3G, the methodology for final processing is similar to the CLSEG process described in an article entitled Vertical Bipolar Transistors Fabricated in Local Silicon-On-Insulator Films Prepared Using CLSEG written by Schubert and coinventor Neudeck, and published in IEEE Transactions on Electron Devices, Vol. 37, No. 11, pp. 2336-2342, November 1990, the disclosure of which is incorporated herein by reference. For example, as shown in FIG. 3E, LTO oxide/nitride layers 53 and 54, respectively, are deposited for cavity support and a via hole 55 is opened.

Now referring to FIG. 3F, the sacrificial amorphous silicon regions 52A and 44 are selectively etched out to form a cavity 56. Seed hole 51 is again etched to open a clean hole to the substrate 40. Now the structure is ready for epitaxial growth using CLSEG.

Once the epitaxial growth of monocrystalline silicon 57 within the cavity is performed, the LTO oxide/nitride layers 53 and 54 are removed to form the structure as shown in FIG. 3G.

Figure 3H:
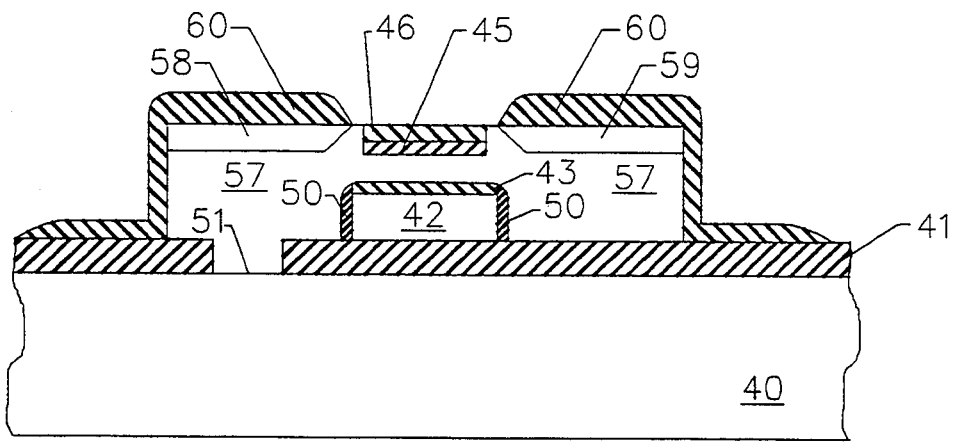
Figure 3I:
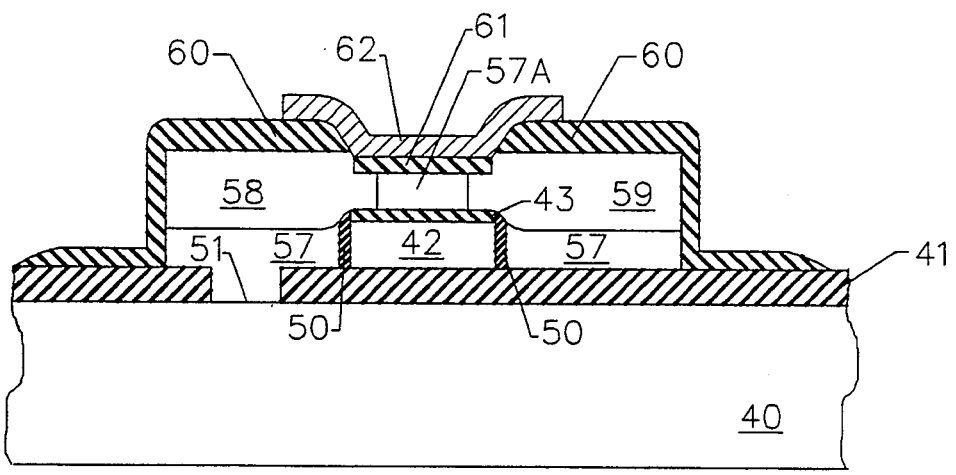
Figure 3J:
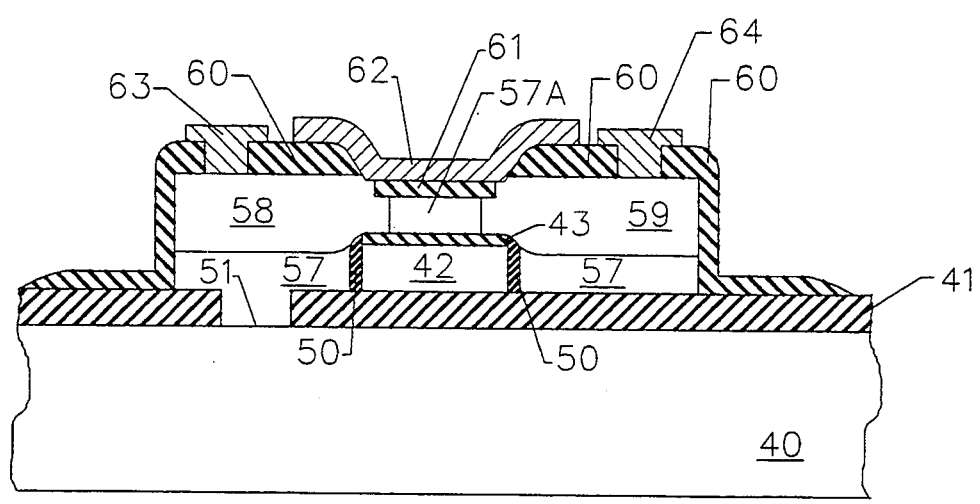

Now referring to FIG. 3H, source 58 and drain 59 regions are then implanted and a low temperature oxidation is used to form an oxide 60 over the source and drain regions. The nitride layer 46 prevents oxidation of the stack 47. As shown in FIG. 3I, the thin nitride layer 46 is then removed and the underlying oxide 45 can be etched away if a replacement for the second insulating layer is desired. If implantation into the channel region 57A is needed to adjust the threshold voltage, it can be made at this time. Otherwise, a brief oxidation of the channel is preferred to grow a replacement for the second insulating layer 61 and drive-in the impurities in the source 58 and drain 59 regions. Next, a top gate material of polysilicon or metal 62 can be deposited and patterned. Finally, source 63 and drain 64 contacts can be made through oxide 60 to contact the source and drain, respectively, as shown in FIG. 3J. It should be noted that this alternative method provides a way to achieve the self-aligned structure with one epitaxial growth instead of two, as described in the first embodiment.

Accordingly, a dual-gated semiconductor-on-insulator field effect transistor formed according to an alternative method comprises a substrate 40; a gate electrode insulating layer 41; a first (bottom) gate electrode 42; a first insulating layer 43; a channel 57A; a second insulating layer 61; a second (top) gate electrode 62; a source 58 and source contact 63; and a drain 59 and drain contact 64.

The methods according to the present invention produce a field effect transistor with improved performance, reduced source and drain resistance, two independently controllable self-aligned gate electrodes, and tailored source and drain doping profiles with vertically elevated and displaced source and drain contacts. Because of the novel technique for aligning the first and second gate electrodes below and above the monocrystalline silicon channel, the parasitic capacitances between the gates and other regions are minimized. Moreover, the size, orientation and doping profiles in the source and drain provide for reduced hot electron injection, improved latch-up immunity and reduced resistance.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A dual-gate field effect transistor having self-aligned first and second gate electrodes, comprising:
   a semiconductor substrate having a gate electrode insulating layer on one face thereof;
   a first gate electrode on said gate electrode insulating layer, said first gate electrode having first and second ends which define a first length of said first gate electrode;

a first insulating layer on said first gate electrode;

a sidewall insulating region on said first and second ends of said first gate electrode, so that said gate electrode insulating layer, said first insulating layer and said sidewall insulating region surround and electrically isolate said first gate electrode;

a monocrystalline semiconductor channel region on said first insulating layer, having first and second ends which overlap said first gate electrode and define a second length of said channel region which is less than the first length;

a second insulating layer on said monocrystalline semiconductor channel region;

a second gate electrode on said second insulating layer, said second gate electrode having first and second ends which overlap said channel region and define a third length of said second gate electrode which is less than the second length; and a source and a drain electrically contacting said first and second ends of said monocrystalline semiconductor channel region, respectively.

2. The dual-gate field effect transistor of claim 1, wherein said source and drain each comprise a first and a second semiconducting region having different impurity concentrations, and wherein only said first semiconducting regions make direct electrical contact with said channel region.

3. The dual-gate field effect transistor of claim 2, wherein said first semiconducting region is more lightly doped, than said second semiconducting region.

4. The dual-gate field effect transistor of claim 2 further comprising source and drain ohmic contacts electrically contacting only said second semiconducting region.

5. An integrated circuit comprising:

a substrate having an insulating layer on one face thereof;

a first semiconductor-on-insulator dual-gate field effect transistor comprising:

a first source and a first drain on said insulating layer;

a first semiconductor channel region on said insulating layer, between said first source and said first drain;

a first bottom gate electrode between said insulating layer and said first semiconductor channel region, said first bottom gate electrode having first and second ends which define a first length of said first bottom gate electrode; and a first top gate electrode on said first semiconductor channel region and opposite said first bottom gate electrode, rod gate electrode having first and second ends which define a second length of said first gate electrode which is less than the first length so that the ends of said first electrode overlap said first electrode; and a second semiconductor-on-insulator dual-gate field effect transistor comprising:

a second source and a second drain on said insulating layer;

a second semiconductor channel region on said insulating layer, between said second source and said second drain;

a second bottom gate electrode between said insulating layer and said second semiconductor channel region, said second bottom gate electrode having first and second ends which define a third length of said second bottom gate electrode; and a second top gate electrode on said second semiconductor channel region and opposite said second bottom gate electrode, said second top gate electrode having first and second ends which define a fourth length of said second top gate electrode which is less than the third length so that the ends of said second top gate electrode overlap said second bottom gate electrode;

said first and said second bottom gate electrodes being electrically insulated from one another, to thereby allow independent electrical control of said first and second bottom gate electrodes.

6. The integrated circuit of claim 5, wherein said first and second channel regions comprise first and second monocrystalline semiconductor channel regions, respectively.

7. A dual-gate field effect transistor comprising:

a semiconductor substrate having a first face;

a first gate electrode on said first face and having first and second ends thereof which define a first length of said first gate electrode;

a first insulating layer on said first gate electrode;

a monocrystalline semiconductor channel region, having first and second ends thereof, on said first insulating layer and extending opposite said first gate electrode;

a second insulating layer on said monocrystalline semiconductor channel region, opposite said first insulating layer;

a second gate electrode on said second insulating layer, opposite said monocrystalline semiconductor channel region, said second gate electrode having first and second ends which overlap said first gate electrode and define a second length of said second gate electrode which is less than the length of said first gate electrode so that the first and second ends of said first and said second gate electrodes lie at the corners of a trapezoid when viewed in transverse cross-section; and a monocrystalline source and a monocrystalline drain electrically contacting said first and second ends of said monocrystalline semiconductor channel region, respectively.

8. The dual-gate field effect transistor of claim 7 further comprising a gate electrode insulating layer between said first gate electrode and said first face.

9. The dual-gate field effect transistor of claim 8 further comprising a sidewall insulating region on said first and second ends of said first gate electrode so that said gate electrode insulating layer, said sidewall insulating region and said first insulating layer surround said first gate electrode to thereby electrically isolate said first gate electrode from adjacent non-insulating regions.

10. The dual-gate field effect transistor of claim 7 wherein said monocrystalline source and drain each comprise a first and a second region of different impurity concentration and wherein only said first regions make direct electrical contact with said monocrystalline channel region.

11. The dual-gate field effect transistor of claim 7 further comprising a drain contact ohmically contacting said monocrystalline drain, and wherein said monocrystalline drain comprises a first relatively lightly doped region adjacent said monocrystalline channel region at the second end and a second relatively highly doped region adjacent said drain contact so that only said first relatively lightly doped region makes direct electrical contact to said monocrystalline channel region at the second end.

12. The dual-gate field effect transistor of claim 11, wherein said drain contact is vertically elevated relative to the second end of said monocrystalline channel region to thereby suppress the electric field at the second end during pinch-off operation.

* * * * *

UNITED STATES PATENT AND TRADEMARK OFFICE
CERTIFICATE OF CORRECTION

PATENT NO. : 5,349,228
DATED : September 20, 1994
INVENTOR(S) : Gerold W. Neudeck, Suresh Venkatesan It is certified that error appears in the above-identified patent and that said Letters Patent is hereby corrected as shown below:

<u>Column 6</u>, line 54, delete "be" and substitute --18-- therefor.

<u>In the Claims</u>:

<u>Column 9</u> line 53, delete "rod" and substitute --said first top-- therefor;

line 55, after "first" insert --top--;

line 56, after "first" (second occurrence) insert --top gate--; and line 57, after "first" insert --bottom gate--.

Signed and Sealed this

Nineteenth Day of September, 1995

Attest:

BRUCE LEHMAN

*Attesting Officer*  *Commissioner of Patents and Trademarks*